United States Patent
Milenin et al.

(10) Patent No.: US 9,343,329 B2
(45) Date of Patent: May 17, 2016

(54) CONTACT FORMATION IN GE-CONTAINING SEMICONDUCTOR DEVICES

(71) Applicant: IMEC VZW, Leuven (BE)

(72) Inventors: Alexey Milenin, Leuven (BE); Liesbeth Witters, Linden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/620,766

(22) Filed: Feb. 12, 2015

(65) Prior Publication Data

US 2015/0228502 A1    Aug. 13, 2015

(30) Foreign Application Priority Data

Feb. 13, 2014 (EP) .................... 14154933

(51) Int. Cl.
*H01L 21/3205* (2006.01)
*H01L 21/311* (2006.01)
(Continued)

(52) U.S. Cl.
CPC .... *H01L 21/32051* (2013.01); *H01L 21/28568* (2013.01); *H01L 21/31116* (2013.01); *H01L 21/31144* (2013.01); *H01L 29/16* (2013.01); *H01L 29/41791* (2013.01);
(Continued)

(58) Field of Classification Search
CPC ............ H01L 21/32051; H01L 21/76879; H01L 21/28562; H01L 21/288; H01L 21/76843; H01L 21/823807; H01L 29/6659; H01L 29/7833; H01L 29/665; H01L 29/6656
USPC ................... 438/676; 257/288, 616
See application file for complete search history.

(56) References Cited

U.S. PATENT DOCUMENTS

| 5,366,590 A | 11/1994 | Kadomura |
| 5,783,496 A | 7/1998 | Flanner et al. |

(Continued)

FOREIGN PATENT DOCUMENTS

| EP | 0746017 A2 | 12/1996 |
| JP | 2007123415 | 5/2007 |

OTHER PUBLICATIONS

European Search Report, European Patent Application 14154933.7, dated Jun. 25, 2014.
(Continued)

*Primary Examiner* — Monica D Harrison
(74) *Attorney, Agent, or Firm* — McDonnell Boehnen Hulbert & Berghoff LLP

(57) ABSTRACT

A process for creating a contact on a Ge-containing contact region of a semiconductor structure, said process comprising the steps of:
  providing said semiconductor structure comprising:
    (i) a Ge-containing contact region,
    (ii) optionally, a $SiO_2$ layer coating said Ge-containing contact region,
    (iii) a $Si_3N_4$ layer coating said $SiO_2$ layer if present or said Ge-containing contact region;
  etching selectively the $Si_3N_4$ layer by means of an inductively coupled plasma, thereby exposing the underlying $SiO_2$ layer if present or the Ge-containing contact region;
  etching selectively the $SiO_2$ layer if present, thereby exposing the SiGe:B contact region; and
  creating said contact on said Ge-containing contact region.

18 Claims, 10 Drawing Sheets

(51) Int. Cl.
  H01L 29/16    (2006.01)
  H01L 29/78    (2006.01)
  H01L 29/66    (2006.01)
  H01L 21/285   (2006.01)
  H01L 29/417   (2006.01)
  H01L 29/45    (2006.01)

(52) U.S. Cl.
  CPC ......... *H01L 29/45* (2013.01); *H01L 29/66795* (2013.01); *H01L 29/7842* (2013.01); *H01L 29/7851* (2013.01)

(56) References Cited

U.S. PATENT DOCUMENTS

| | | | |
|---|---|---|---|
| 5,786,276 A | 7/1998 | Brooks et al. | |
| 6,228,774 B1 | 5/2001 | Marquez | |
| 6,962,879 B2 | 11/2005 | Zhu et al. | |
| 8,377,779 B1 | 2/2013 | Wang | |
| 9,040,422 B2 * | 5/2015 | Wang et al. | 438/676 |
| 2003/0121888 A1 | 7/2003 | Adachi | |
| 2004/0169269 A1 | 9/2004 | Yeo et al. | |
| 2005/0253203 A1 | 11/2005 | Liaw | |
| 2006/0017119 A1 | 1/2006 | Jin et al. | |
| 2006/0157749 A1 | 7/2006 | Okuno | |
| 2007/0093055 A1 | 4/2007 | Chou et al. | |
| 2007/0249177 A1 | 10/2007 | Koemtzopoulos et al. | |
| 2008/0048262 A1 | 2/2008 | Lee et al. | |
| 2012/0119268 A1 * | 5/2012 | Wu et al. | 257/288 |
| 2013/0029494 A1 | 1/2013 | Sasaki et al. | |

OTHER PUBLICATIONS

Schaepkens, Marc et al., "A Review of SiO2 Etching Studies in Inductively Coupled Fluorocarbon Plasmas", Journal of the Electrochemical Society, vol. 148, No. 3, 2001, pp. C211-C221.

Schaepkens, M. et al., "Study of the SiO2-to-Si3N4 Etch Selectivity Mechanism in Inductively Coupled Fluorocarbon Plasmas and a Comparison with the SiO2-to-Si Mechanism", J. Vac. Sci. Technol. A, vol. 17 No. 1, Jan./Feb. 1999, pp. 26-37.

Iijima, Yukio et al., "Highly Selective SiO2 Etch Employing Inductively Coupled Hydro-Fluorocarbon Plasma Chemistry for Self Aligned Contact Etch", Jpn. J. Appl. Phys., vol. 36, Part 1, No. 9A, Sep. 1997, pp. 5498-5501.

Wang, Judy et al., "Enhanced Self Aligned Contact (SAC) Etch Stop Window by Using C4F6 Chemistry", IEEE/SEMI Advanced Semiconductor Manufacturing Conference, Munich, Apr. 23-24, 2001, pp. 101-105.

Alba, Simone, "Historical Trends for Gases Used in Dielectric Etch Applications", Future Fab Intl., www.maltiel-consulting.com/Gas_systems_Fluorocarbon_(CF4,_CHF3)_Used_Dielectric_Etch.htm, Oct. 24, 2013, pp. 1-7.

Wang, Xin-Peng et al., "Dry Etching Solutions to Contact Etch for Advanced Logic Technologies", ECS Transactions, vol. 52, No. 1, 2013, pp. 343-348.

* cited by examiner

CONTACT FORMATION IN GE-CONTAINING SEMICONDUCTOR DEVICES

CROSS-REFERENCE

This application claims priority from European Patent App. No. EP14154933.7, filed Feb. 13, 2014, which is incorporated by reference in its entirety.

TECHNICAL FIELD OF THE DISCLOSURE

The present disclosure relates to the field of contact formation in semiconductor devices, and more specifically to a process for creating contacts in strained Ge bulk fin field effect transistors (Ge-BFFT). The present disclosure also relates to semiconductor structures comprising contacts obtained thereby.

BACKGROUND OF THE DISCLOSURE

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A finFET is a FET in which the transistor channel is a semiconducting "fin." For instance, the gate dielectric and gate may be positioned on both sides of the fin such that current flows down the channel on the two sides of the fin. FinFETs allow superior channel charge control even at extremely short gate lengths.

In the future technological nodes of FinFETs, Ge is likely to take an important place as a substitute for Si for the channel formation. This change will however be accompanied by notable fabrication challenges. In particular, creating contacts on a source and/or drain comprising Ge and in particular strained Ge presents considerable challenges due in part to the difficulty to establish such contacts without damaging the geometry of the said source and/or drain. Damages to the geometry of the source and/or drain may lead to increased contact resistivity, lower on/off ratio and/or channel damage in subsequent processing steps. There is therefore a need in the art for processes enabling the formation of contacts with minimal damages to the contact region.

SUMMARY OF THE DISCLOSURE

It is an object of the present disclosure to provide good methods for forming contacts in semiconductor devices.

The above objective is accomplished by a method and device according to the present disclosure.

In a first aspect, the present disclosure relates to a process for creating a contact on a Ge-containing contact region of a semiconductor structure, said process comprising the steps of:

(a) Providing said semiconductor structure comprising:
  i. A Ge-containing contact region,
  ii. Optionally, a $SiO_2$ layer coating said Ge-containing contact region,
  iii. A $Si_3N_4$ layer coating said $SiO_2$ layer if present or said Ge-containing contact region, (c) Etching selectively the $Si_3N_4$ layer by means of an inductively coupled plasma, thereby exposing the underlying $SiO_2$ layer if present or the Ge-containing contact region, (d) Etching selectively the $SiO_2$ layer if present, thereby exposing the Ge-containing contact region, and (e) Creating said contact on said Ge-containing contact region.

This process is advantageous because it permits to create good contacts on Ge-containing contact regions while conserving the dimensions of said Ge-containing contact regions.

In an embodiment, the semiconductor structure provided in step (a) may comprise both a Ge-containing contact region and a Ge-containing non-contact region. In that case, the non-contact region can be coated with the optional $SiO_2$ layer and a $Si_3N_4$ layer may coat the $SiO_2$ layer (if present) or the Ge-containing non-contact region.

In other embodiments, the semiconductor structure may be a Field Effect Transistor (FET) or an intermediate to the fabrication of a Field Effect transistor. Such an intermediate can for instance comprise a dummy gate structure. The Field Effect Transistor is preferably a Fin-FET such as a Ge-BFFT. If the semiconductor structure is a Field Effect Transistor or an intermediate to the fabrication of a Field Effect transistor, the Ge-containing contact region may be part of the drain or of the source of the FET. In embodiments, the Ge-containing region may comprise two contact regions (e.g. one being part of a drain and one being part of a source). In these embodiments, the Ge-containing region may also comprise at least two non-contact regions (at least one being part of the drain and at least one being part of the source). In embodiments, the contact region and the non-contact region of a Ge-containing region may be distinct portions of a Ge-containing region positioned subsequently along the longitudinal direction of the Ge-containing region. For instance, the contact region and the non-contact region of a drain may be distinct portions of a drain positioned subsequently along the longitudinal axis of the drain.

In a second aspect, the present disclosure refers to a semiconductor structure comprising:
  a Ge-containing region,
  a $SiO_2$ layer coating said Ge-containing region, and
  a $Si_3N_4$ layer coating said $SiO_2$ layer.

This structure can be an intermediate structure obtained as the result of step (a) in some embodiments of the present disclosure. Its presence can be a signature that the process according to some embodiments of the first aspect is being used.

On another hand, when the Ge-containing contact region of the first aspect is part of a larger Ge-containing region, the Ge-containing region will comprise the contact region as well as at least a non-contact region. In that case, both the Ge-containing contact region and the Ge-containing non-contact region can be coated with a $SiO_2$ layer and a $Si_3N_4$ layer in some embodiments of the present disclosure. In such a case, following the process of the first aspect, only the Ge-containing contact region will see the etching of its $SiO_2$ and $Si_3N_4$ layer while the $SiO_2$ and $Si_3N_4$ layers of the Ge-containing non-contact region will remain intact and will still be present in the final device, which can for instance be a Field Effect Transistor. Therefore, the presence of the structure of the second aspect in a semiconductor device can be a signature that the process according to some embodiments of the first aspect has been used in the manufacture of this semiconductor device.

In a third aspect, the present disclosure relates to a semiconductor structure comprising a Ge-containing region extending longitudinally along a direction (X), said region comprising a contact region and a non-contact region positioned subsequently along the longitudinal direction (X), wherein said contact region has a contact created thereon, and wherein the dimensions of a vertical cross-section through said Ge-containing contact region and the dimensions of a vertical cross-section through said Ge-containing non-contact region are substantially the same. For instance, the area of the cross-section of the contact region and the area of the cross-section of the non contact region may be within 5%, 2%, preferably 1% of one another. Also preferably, the width and the height of the cross-section of the contact region and of the cross-section of the non contact region may be within 5%, 2%, preferably 1% of one another.

In other words, in the third aspect, the present disclosure relates to a semiconductor structure comprising a Ge-containing region extending longitudinally along a direction (X), said region being divided along said direction (X) between a contact region and (at least) a non-contact region, wherein said contact region has a contact created thereon, and wherein the dimensions of a vertical cross-section through said Ge-containing contact region and the dimensions of a vertical cross-section through said Ge-containing non-contact region are substantially the same.

In an embodiment, the Ge-containing region may extend longitudinally along a direction (X) and the contact region and the non-contact region may be positioned subsequently along the longitudinal direction (X).

Such a semiconductor structure is the typical result of the process of the first aspect where said process is applied to a semiconductor structure comprising a Ge-containing region, said Ge-containing region comprising a contact region and a non-contact region.

Particular and preferred aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
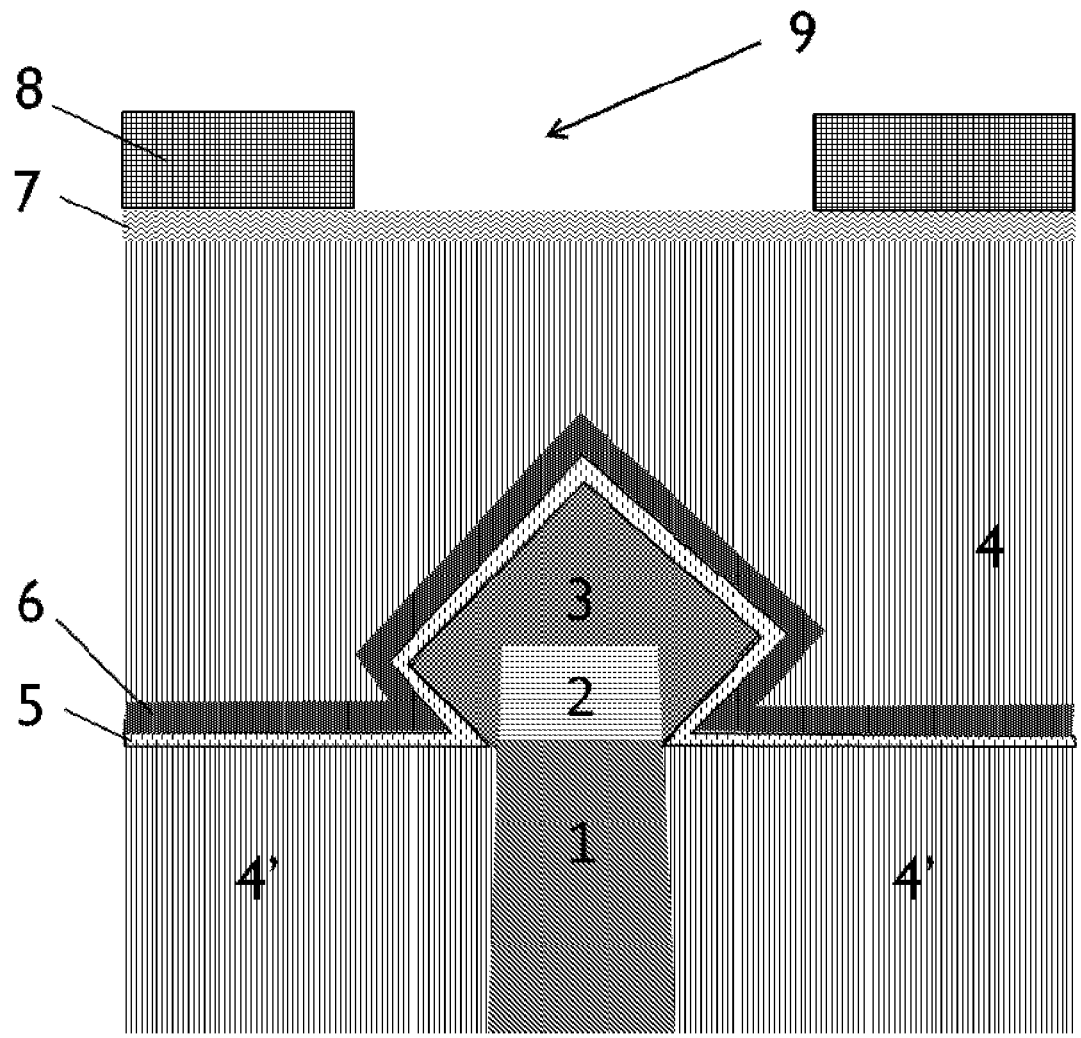
FIG. 1 to FIG. 4 are vertical cross-sections, each representing the end result of a step of a process according to an embodiment of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "inductively coupled plasma" or "ICP" refers to a type of plasma resulting from the interaction of a gas with electric currents produced by electromagnetic induction, that is, by time-varying magnetic fields.

As used herein and unless provided otherwise, the term "capacitively coupled plasma" or "CCP" refers to a type of plasma resulting from the interaction of a gas with an electric field produced between two electrodes separated by a (small) distance, thereby producing electrons within said gas. These electrons are then accelerated by a radio-frequency power supply, thereby producing a plasma.

As used herein and unless provided otherwise, the term fluorocarbon refers to compounds comprising carbon and fluorine. Preferably, the fluorocarbons used in the context of the present disclosure are compounds consisting of carbon, fluorine and optionally hydrogen. More preferably, they may be represented by the formula $C_xF_yH_z$, wherein x is from 1 to 5, y is at least 1 and y+z is selected from 2x−2, 2x and 2x+2. For example, the fluorocarbon may be selected from the group consisting of $CF_4$, $C_2F_6$, $C_4F_8$, $C_5F_8$, $C_3F_6$, $C_3F_8$, $C_4F_6$, $CH_3F$, $C_2HF_5$, $CHF_3$, $CH_2F_2$ and mixtures thereof. In preferred embodiments, this fluorocarbon can be selected from $CH_3F$, $CF_4$, $C_4F_8$ and $C_4F_6$.

As used herein and unless provided otherwise, the term oxygen reactant refers to a gas molecule comprising at least one oxygen atom. Preferably, this gas molecule has from two to three atoms. Examples of oxygen reactants are $O_2$, $O_3$, CO, $H_2O$ and mixture thereof. Preferably, the oxygen reactant comprises or is $O_2$.

As used herein and unless provided otherwise, the term inert carrier gas refers to noble gases. Preferably it is Ar.

As used herein and unless provided otherwise, the term "germanide" relates to a solid solution or alloy of Ge and a metal (e.g. Ni). The term "germaniding" refers to the forming of such a solid solution or alloy.

As used herein and unless provided otherwise, the term Ge-containing region refers to a region or a semiconductor structure comprising Ge. This region can either be a contact region, i.e. a region where an electrical contact will be or is created (e.g. by germanidation), or a non-contact region, i.e. a region where no electrical contact will be created. Preferably, the Ge-containing region is a strained Ge-containing region. A strained Ge-containing region is advantageous as it presents a higher mobility than relaxed Ge-containing region. Relaxed (i.e. not strained) Ge-containing regions are however also suitable for use in the present disclosure. Preferably, the Ge-containing region is an alloy comprising Ge, Si and optionally Sn. For instance, it can be a Si—Ge—Sn alloy with from 40 to 95% Ge and from 0 to 8% Sn. A Si—Ge alloy is preferred. A Si—Ge alloy comprising from 40 to 95% Ge is more preferred. A Si—Ge alloy comprising from 50 to 90% Ge is even more preferred. A Si—Ge alloy comprising from 60 to 85% Ge is most preferred. In preferred embodiments, the Ge-containing region is a doped Si—Ge—Sn or Si—Ge alloy as defined above. Yet more preferably, it is a p-doped Si—Ge—Sn or Si—Ge alloy as defined above and most preferably it is a boron doped Si—Ge—Sn or Si—Ge alloy as defined above. Most preferably, it is a boron doped Si—Ge alloy, herein noted as SiGe:B. The doping level is preferably at least $10^{19}$ at/cm$^3$ and more preferably at least $10^{20}$ at/cm$^3$. In the prior art, Ge containing material, especially Si—Ge alloys and in particular doped Si—Ge alloys such as SiGe:B are typically etched with a speed too similar to the etching of $Si_3N_4$ to allow good selectivity. This makes the present disclosure particularly useful for the metallization of such materials.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

Figure 5:
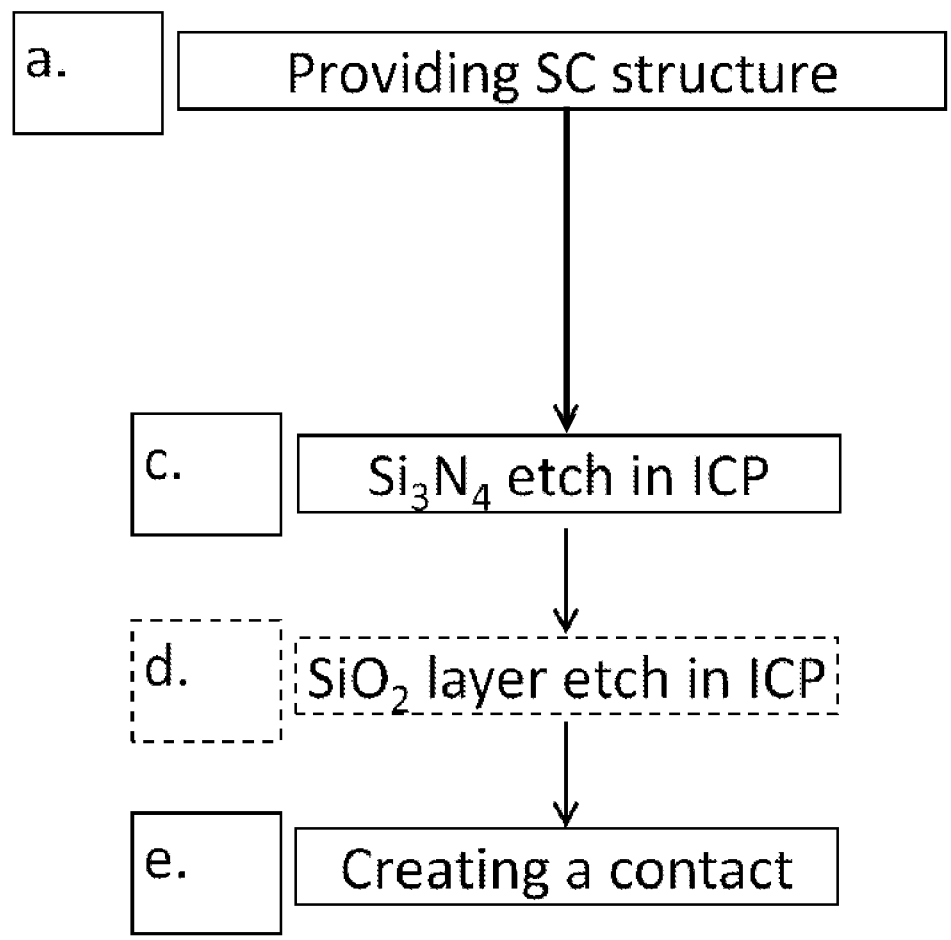
FIG. 5 is a flowchart representing processes according to embodiments of the present disclosure.

FIG. 5 shows a flowchart summarizing a process for creating contacts according to an embodiment of the present disclosure. Such contacts may, for example, be metalized surface segments of contact regions (e.g. part of the source region and part of the drain region of a field effect transistor). The contacts may be adapted for providing low electrical resistance interfaces for connecting other integrated components to the device in a semiconductor integrated circuit system.

Step (a) (see FIGS. 5, 6 and 8) comprises providing a semiconductor (SC) structure. Although not specified in FIGS. 5, 6 and 8, the semiconductor structure comprises (see FIG. 1 and FIG. 5):
  i. A Ge-containing (e.g. a SiGe:B) contact region (3),
  ii. An optional $SiO_2$ layer (5) coating said Ge-containing (e.g. a SiGe:B) contact region (3), and
  iii. A $Si_3N_4$ layer (6) coating said $SiO_2$ layer (5) if present or said Ge-containing (e.g. a SiGe:B) contact region.

The semiconductor structure may further comprise:
  iv. A $SiO_2$ blanket (4) covering said $Si_3N_4$ layer (6),
  v. An anti-reflective coating (7) covering said $SiO_2$ blanket (4), and
  vi. A photoresist pattern (8) provided over said anti-reflective coating (7). In the later case, the flowchart of FIGS. 6 and 8 more precisely defines the steps that can be undertaken by including an etching step (b) for the anti-reflective coating (7) and for the $SiO_2$ blanket (4).

In an embodiment, the Ge-containing (e.g. a SiGe:B) contact region (3) may be covering a Ge fin (2). The Ge fin (2) is a fin made of Ge.

As can be seen in FIG. 1, in an embodiment, the Ge fin (2) may extend above a SiGe fin (1) buried in a dielectric blanket (4') covering a semiconductor substrate (not shown). In an embodiment, said dielectric blanket (4') may be a $SiO_2$ blanket (4'). In an embodiment, said dielectric blanket (4') may have a thickness of from 50 to 1000 nm, preferably from 100 to 600 nm, more preferably from 200 to 500 nm.

Figure 9:
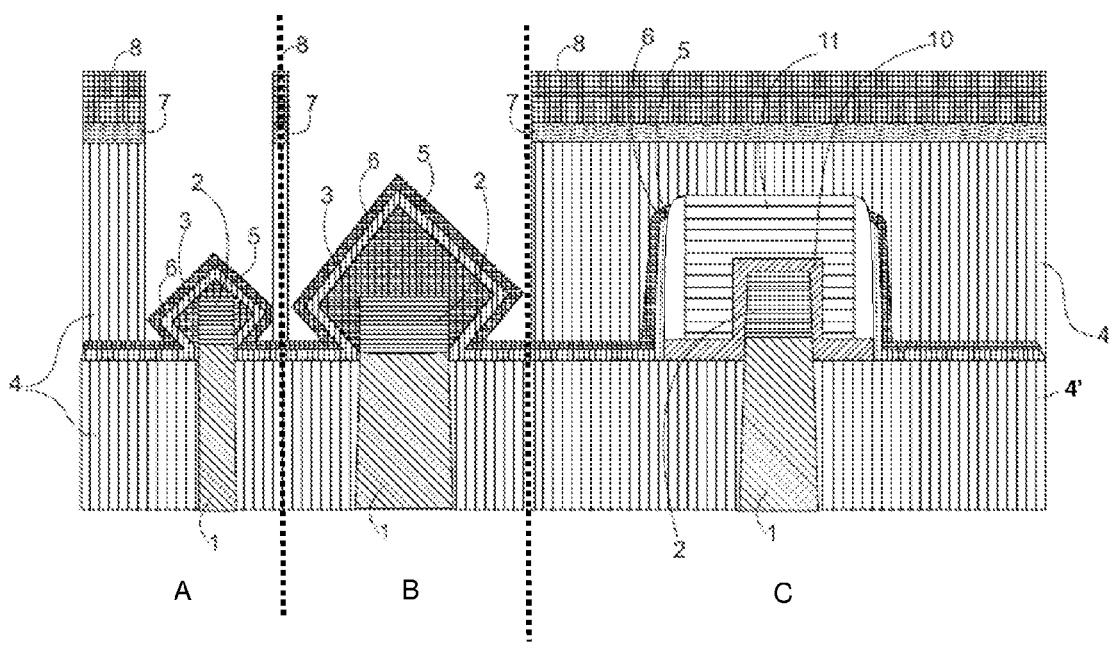
FIG. 9 is a composite diagram showing three structures A, B and C. A is a vertical cross-section of a contact region of a Field Effect Transistor, as obtained at the end of step (b). B is a vertical cross-section of a contact region of a different Field Effect Transistor, as obtained at the end of step (b) and only differs from A by its size. C is a vertical cross-section of a gate structure of the Field Effect Transistor of which A or B is a contact region under construction.

The presence of the $SiO_2$ layer (5), although optional, is very advantageous as it greatly enhances the selectivity of the $Si_3N_4$ layer (6) etching compared to the situation where the $SiO_2$ layer (5) is not present. Without being bound by theory, this can be due to both the etching rate ratio $R(Si_3N_4)/R(SiO_2)$ and the etching rate ratio $R(SiO_2)/R(Ge\text{-containing material})$ being significantly larger than the etching rate ratio $R(Si_3N_4)/R(Ge\text{-containing material})$. Hence, although damage to the geometry of the contact region (3) upon etching can be prevented when the etching of the $Si_3N_4$ layer (6) is performed in a inductively coupled plasma reactor ICP (as compared to etchings of $Si_3N_4$ layers performed in a capacitively coupled plasma reactor CCP wherein the geometry of the contact region (3) is clearly damaged), the use of the $SiO_2$ layer (5), still further improve the etching selectivity. It is for instance advantageously used when more than one semiconductor structure (e.g. more than one fin) are present and the critical dimensions (CDs) distribution of these structures (e.g. fins) is wide. This situation is represented in FIG. 9 wherein fins A and B of different critical dimensions are shown.

Another advantage of the $SiO_2$ layer (5), is that it serves as a barrier against diffusion to or from the Ge-containing region.

In an embodiment, the $SiO_2$ layer (5) may be deposited on the Ge-containing contact region (3) (and typically on a non-contact region of the Ge-containing region as well) via plasma-enhanced atomic layer deposition (PEALD). This is advantageous as it permits a conformal deposition of the $SiO_2$ layer (5). This permits a uniform removal of the $SiO_2$ layer (5) and makes the etching time necessary to remove the $SiO_2$ layer (5) more predictable. It also permits to deposit a minimum amount of $SiO_2$ for a maximum enhancement of the etching selectivity.

Step (b) (when present, see FIGS. 6 and 8) comprises etching selectively the anti-reflective coating (ARC) (7) (sub-step (b1)) and the $SiO_2$ blanket (4) (sub-step (b2)) by means of a capacitively coupled plasma (CCP) through the photoresist pattern (8), thereby exposing the underlying $Si_3N_4$ layer (6). Typically, the plasma of step (b) is generated via the use of a radio frequency power supply. For instance, said radio frequency may be from 0.5 MHz to 100 MHz, preferably from 1 MHz to 50 MHz.

In embodiments, the plasma of step (b) may be generated at a power of from 400 to 1500 W.

In an embodiment, step (b) may last from 20 to 100 seconds.

The temperature of the reactor before plasma generation may for instance be from 10 to 50° C.

In an embodiment, the plasma used in step (b) may be produced from an etching gas comprising a fluorocarbon reactant.

In an embodiment, step (b) may be performed under vacuum, preferably at a pressure below 100 mtorr.

In an embodiment, step (b) may comprise a first sub-step (b1) for etching the anti-reflective coating (7) and a subsequent sub-step (b2) for etching the $SiO_2$ blanket (4). The first sub-step (b1) uncovers the $SiO_2$ blanket (4). The subsequent sub-step (b2) uncovers the $Si_3N_4$ layer (6).

Both sub-steps (b1) and (b2) are performed by means of a capacitively coupled plasma (CCP) through the photoresist pattern (8). Typically, both sub-steps (b1) and (b2) are performed via the use of a radio frequency power supply.

For instance, for sub-step (b1), said radio frequency may be from 0.5 MHz to 100 MHz, preferably from 1 MHz to 50 MHz, yet more preferably from 10 to 35 MHz. For instance 13.5 MHz or 27 MHz can be used.

In embodiments, the plasma of sub-step (b1) may be generated at a power of from 400 to 1500 W, preferably from 400 to 1000 W, more preferably from 550 to 850 W such as for instance 700 W.

In an embodiment, sub-step (b1) may last from 5 to 45 seconds, preferably from 10 to 40 seconds, yet more preferably from 15 to 40 seconds. The temperature of the reactor before plasma generation may for instance be from 10 to 50° C.

In an embodiment, the plasma used during sub-step (b1) may be produced from an etching gas comprising a fluorocarbon reactant and an optional inert carrier gas. The fluorocarbon reactant used for the first sub-step (b1) may be as defined above. In a particularly preferred embodiment, it is $CF_4$.

In an embodiment, the plasma used during sub-step (b1) may be produced from an etching gas consisting in a fluorocarbon, for instance consisting in $CF_4$.

In an embodiment, the etching gas comprising a fluorocarbon reactant may be provided at a flow rate of from 50 to 1000 standard cubic centimeter per minute (sccm), preferably from 75 to 500 sccm, yet more preferably from 100 to 400 sccm and most preferably from 150 to 250 sccm.

Within the meaning of the present disclosure, when a gas (e.g. etching gas comprising a fluorocarbon reactant) is provided as a combination of different component gases (e.g. two different fluorocarbon reactants), each delivered as a separate flow, the flow rate mentioned for that gas is the sum of the individual flow rates for each component gas (e.g. each fluorocarbon reactant).

For sub-step (b2), said radio frequency may be from 0.5 MHz to 100 MHz, preferably from 1 MHz to 70 MHz. In embodiments, the plasma of step (b2) may be generated at a power of from 400 to 1500 W, preferably from 500 to 1400 W, more preferably from 600 to 1300 W. In a preferred embodiment, sub-step (b2) may be performed by means of two radio frequency power supplies.

In an embodiment, the first radio frequency power supply may be coupled to a first electrode and the second radio frequency power supply may be coupled to a second electrode. For instance, the CCP may comprise two parallel electrodes (top and bottom) and the first radio frequency power supply may be coupled to the bottom electrode and the second radio frequency power supply may be coupled to the top electrode.

In another embodiment, both radio frequency power supplies may be coupled to the same (e.g. bottom) electrode. In that case, the other (e.g. top) electrode may be grounded.

In an embodiment, the first radio frequency power supply may operate at a frequency of from 0.5 to 8 MHz, preferably from 1 to 5 MHz, more preferably from 1 to 3 MHz such as for instance 2 MHz. The power delivered by this first power supply during the plasma formation may be from 800 to 1500 W, preferably from 900 to 1400 W, more preferably from 1100 to 1400 W such as for instance 1250 W. The purpose of this power supply is to enable the acceleration toward the bottom electrode of the plasma formed. This power is typically called "bias power".

In an embodiment, the second radio frequency power supply may operate at a frequency of from 12 MHz to 70 MHz, preferably from 20 to 60 MHz such as for instance 27 MHz. The power delivered by this second radio frequency power supply during the plasma formation may be from 400 to 1100 W, preferably from 500 to 1000 W, more preferably from 650 to 850 W such as for instance 750 W. The purpose of this second power supply is to control the plasma density.

In preferred embodiments, the frequency difference between the frequency of the first radio frequency power supply and the second radio frequency power supply may be at least 10 MHz, preferably at least 20 MHz. This is advantageous as it permits a better decoupling of ion energy and plasma density, thereby providing for a better etching.

In an embodiment, sub-step (b2) may last from 15 to 70 seconds, preferably from 20 to 60 seconds, yet more preferably from 25 to 50 seconds. The temperature of the reactor before plasma generation may for instance be from 10 to 50° C.

In an embodiment, the plasma used during subsequent sub-step (b2) may be produced from an etching gas comprising a fluorocarbon reactant (e.g. as defined above), an oxygen reactant and an optional inert carrier gas. The fluorocarbon reactant used for the subsequent sub-step (b2) may be as defined in the definition section above. In a particularly preferred embodiment, it may be selected from $C_4F_8$, $C_4F_6$ and a mixture thereof In an embodiment, the plasma used during sub-step (b2) may be produced from an etching gas comprising or consisting of $O_2$, $C_4F_8$, $C_4F_6$ and Ar.

In an embodiment, the etching gas comprising a fluorocarbon reactant may be provided at a flow rate of from 3 to 100 sccm, preferably from 5 to 50 sccm, yet more preferably from 7 to 40 sccm and most preferably from 15 to 30 sccm.

In an embodiment, the oxygen reactant may be provided at a flow rate of from 3 to 100 sccm, preferably from 5 to 50 sccm, yet more preferably from 7 to 40 sccm and most preferably from 10 to 30 sccm.

In an embodiment, the inert carrier gas (when present) may be provided at a flow rate of from 50 to 1500 sccm, preferably from 5 to 50 sccm, yet more preferably from 100 to 1000 sccm and most preferably from 150 to 500 sccm. In embodiments, the inert carrier gas may comprise more than one type of inert carrier gas provided as separate flows.

In an embodiment, a cleaning step (see FIG. 8) may be performed after step (b) but before step (c) and/or a cleaning step may be performed after step (c) but before step (d), wherein said cleaning step(s) is (are) preferably performed by using a mixture of $N_2O$ and forming gas and/or using HF. Forming gas is a mixture of $N_2$ and $H_2$. The ratio $H_2/N_2$ can vary but forming gas typically comprises 5% vol $H_2$. Preferably, HF is used in liquid form.

Step (c) (see FIGS. 5, 6 and 8) comprises etching selectively the $Si_3N_4$ layer (6) by means of an inductively coupled plasma (ICP), thereby exposing the underlying $SiO_2$ layer (5) if present or the Ge-containing (e.g. a SiGe:B) contact region (3).

In an embodiment, the plasma used in step (c) may be produced from an etching gas comprising a fluorocarbon reactant.

In an embodiment, the plasma of step (c) may be generated at a radio frequency.

In an embodiment, the power delivered by the radio frequency power supply during plasma formation may be from 50 to 2000 W.

In an embodiment, the bias RF voltage may be from 40 to 500V.

In an embodiment, step (c) may last from 30 to 120 seconds.

In an embodiment, step (c) may comprise a first sub-step (c1) and a subsequent sub-step (c2), wherein the plasma used during sub-step (c1) is produced from an etching gas comprising a fluorocarbon reactant and an optional inert carrier gas and wherein the plasma used during the subsequent sub-step (c2) is produced from an etching gas comprising a fluorocarbon reactant, an oxygen reactant and an optional inert carrier gas.

In an embodiment, the etching gas comprising a fluorocarbon reactant of sub-step (c1) may be provided at a flow rate of from 5 to 300 sccm, preferably from 15 to 200 sccm, yet more preferably from 20 to 100 sccm and most preferably from 30 to 75 sccm.

In an embodiment, the inert carrier gas of sub-step (c1) (when present) may be provided at a flow rate of from 5 to 400 sccm, preferably from 15 to 300 sccm, yet more preferably from 20 to 200 sccm and most preferably from 30 to 100 sccm.

In an embodiment, the etching gas comprising a fluorocarbon reactant of sub-step (c2) may be provided at a flow rate of from 50 to 250 sccm, preferably from 100 to 240 sccm, yet more preferably from 150 to 230 sccm and most preferably from 180 to 220 sccm.

In an embodiment, the oxygen reactant of sub-step (c2) may be provided at a flow rate of from 40 to 400 sccm, preferably from 55 to 300 sccm, yet more preferably from 70 to 200 sccm and most preferably from 75 to 150 sccm.

In an embodiment, the inert carrier gas (when present) of sub-step (c2) may be provided at a flow rate of from 5 to 400 sccm, preferably from 15 to 300 sccm, yet more preferably from 20 to 200 sccm and most preferably from 30 to 100 sccm.

In embodiments, the plasma of sub-step (c1) may be generated at a power of from 50 to 1000 W, preferably from 100 to 500 W, more preferably from 150 to 250 W such as for instance 200 W.

In an embodiment, sub-step (c1) may last from 1 to 20 seconds, preferably from 3 to 15 seconds, yet more preferably from 5 to 10 seconds.

In an embodiment, sub-step (c1) may be performed under a bias RF voltage of from 40 to 100 V, preferably from 50 to 80 V such as 65V.

In embodiments, the plasma of sub-step (c2) may be generated at a power of from 200 to 2000 W, preferably from 300 to 1000 W, more preferably from 400 to 600 W such as for instance 500 W.

In an embodiment, sub-step (c2) may last from 20 to 100 seconds, preferably from 30 to 75 seconds, yet more preferably from 35 to 60 seconds.

In an embodiment, sub-step (c2) may be performed under a bias RF voltage of from 100 to 500 V, preferably from 150 to 300 V such as 200 V.

In an embodiment, the plasma used during sub-step (c1) may be produced from an etching gas comprising $CF_4$ and Ar, and wherein the plasma used during sub-step (c2) may be produced from an etching gas comprising $CH_3F$ and $O_2$.

In an embodiment, step (c) may be performed under vacuum, preferably at a pressure below 100 mtorr.

Step (d) (FIGS. 5, 6 and 8) comprises etching selectively the $SiO_2$ layer (if this $SO_2$ layer is present), thereby exposing the Ge-containing (e.g. a SiGe:B) contact region.

In an embodiment, step (d) of etching selectively the $SiO_2$ layer may be performed simultaneously with a cleaning step wherein said cleaning step is preferably performed by using a mixture of $N_2O$ and forming gas and/or by using HF (preferably in a liquid solution form).

Step (e) (FIGS. 5, 6 and 8) comprises creating a contact on said Ge-containing (e.g. a SiGe:B) contact region.

In an embodiment, creating a contact may involve depositing a metal on the Ge-containing (e.g. a SiGe:B)contact region.

This metal may for instance be Ni and said process may further comprise the step of annealing the Ni, thereby germaniding the Ni with the Ge-containing (e.g. a SiGe:B) contact region. In embodiment, the Ni may be deposited by sputtering. The thickness of the deposited Ni may for instance be from 4 to 15 nm, preferably from 6 to 10 nm. After annealing of the Ni, excess Ni may optionally be removed, e.g. with diluted HCl.

In another embodiment, this metal may for instance be W.

Figure 6:
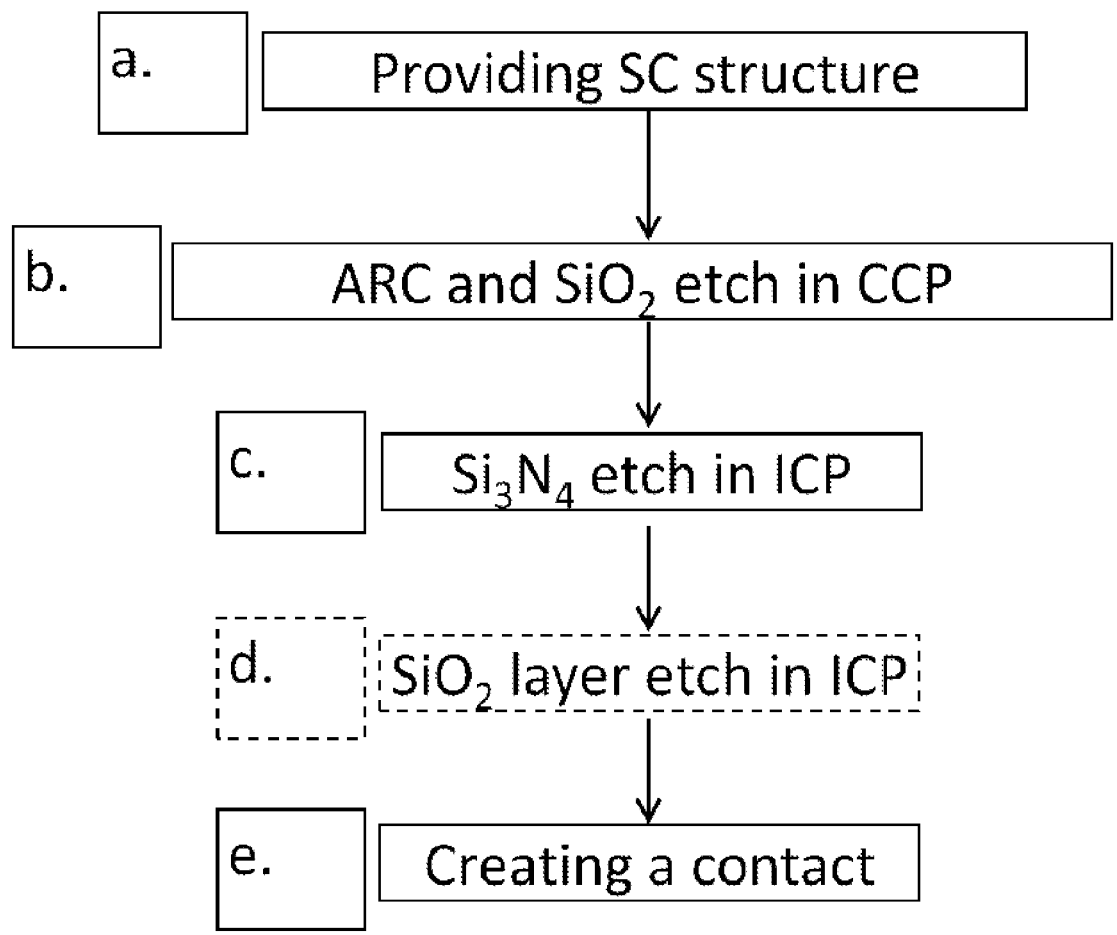
FIG. 6 is a flowchart representing processes according to particular embodiments of the processes represented in the flowchart of FIG. 5
Figure 7:
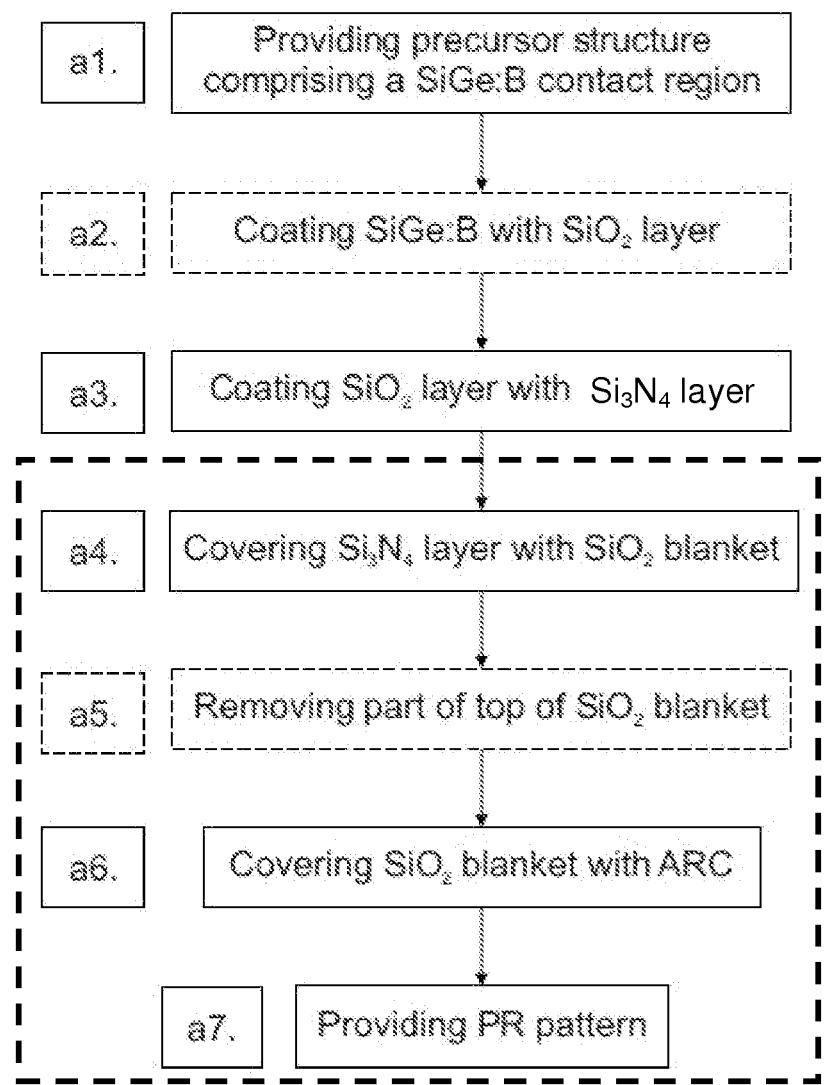
FIG. 7 is a flowchart representing sub-steps of step (a) of the processes of FIG. 5, 6 or 8 according to embodiments of the present disclosure.
Figure 8:
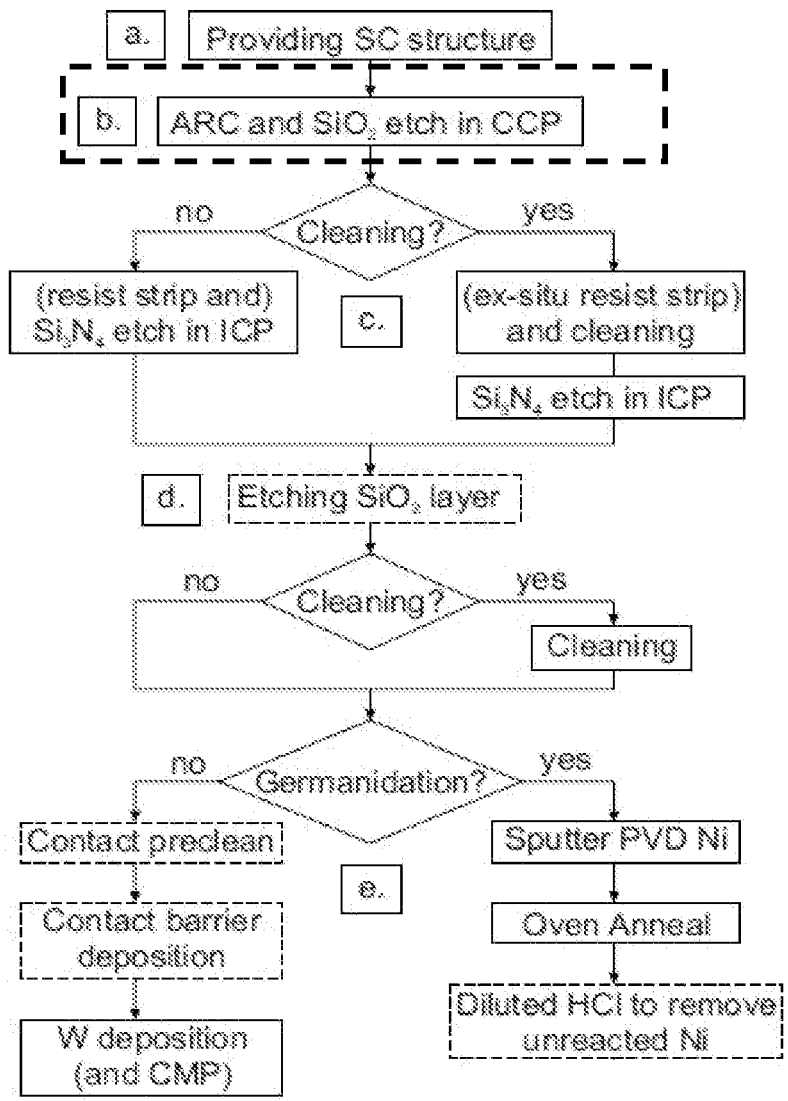
FIG. 8 is a flowchart representing processes according to embodiments of the present disclosure.

FIG. 7 shows a flowchart summarizing sub-steps for providing a semiconductor structure as obtained in step (a) of FIGS. 5, 6 and 8 in an embodiment of the present disclosure. In this embodiment, step (a) comprises the sub-steps of (FIGS. 5, 6 and 8):

a1. Providing a precursor structure comprising a SiGe:B contact region, optionally covering a Ge fin, a2. Optionally coating said SiGe:B contact region with a $SiO_2$ layer, preferably via plasma enhanced atomic layer deposition (PEALD), a3. Coating said $SiO_2$ layer if present or said SiGe:B contact region with a $Si_3N_4$ layer. Preferably, this process further comprises the steps of (FIGS. 6 and 8):

a4. Covering said $Si_3N_4$ layer with a $SiO_2$ blanket, preferably using plasma enhanced chemical vapour deposition (PECVD), a5. Optionally removing part of a top portion of said $SiO_2$ blanket via chemical mechanical planarization, a6. Covering said $SiO_2$ blanket with an anti-reflective coating, and a7. Providing a photoresist pattern over said $SiO_2$ blanket.

In embodiments, the precursor structure may comprise a SiGe:B non-contact region in addition to a SiGe:B contact region. Steps (a2) to (a7) can then also be performed on the non-contact region.

In embodiments, when the semiconductor structure is meant to be part of a field effect transistor (e.g. a FinFET), step (a5) may be performed by removing part of a top portion of said $SiO_2$ blanket until the level of a dummy gate is reached. The dummy gate can then be removed and replaced by a proper gate stack (dielectric and gate electrode).

FIG. 8 shows a flowchart summarizing a process for creating contacts according to an embodiment of the present disclosure. This embodiment is more specific than the embodiment detailed in FIG. 5. It comprises the following steps:

A step (a) of providing a semiconductor (SC) structure. Although not detailed in FIG. 8, the semiconductor structure comprises:
  i. A Ge-containing (e.g. a SiGe:B) contact region optionally covering a Ge fin,
  ii. Optionally, a $SiO_2$ layer coating said Ge-containing (e.g. a SiGe:B) contact region,
  iii. A $Si_3N_4$ layer coating said $SiO_2$ layer if present or said SiGe:B contact region,
  iv. A $SiO_2$ blanket covering said $Si_3N_4$ layer,
  v. A anti-reflective coating covering said $SiO_2$ blanket,
  vi. A photoresist pattern provided over said anti-reflective coating, A step (b) of etching selectively the anti-reflective coating (ARC) and the $SiO_2$ blanket by means of a capacitively coupled plasma (CCP) through the photoresist pattern, thereby exposing the underlying $Si_3N_4$ layer.

At this stage, a cleaning step can be performed (ex-situ) wherein said cleaning step is preferably performed by using a mixture of $N_2O$ and forming gas and/or by using HF, preferably in liquid form. If the ex-situ cleaning step is not performed, the semiconductor structure is directly transferred in an inductively coupled plasma reactor where the $Si_3N_4$ layer will be etched selectively (this correspond to step (c)). The photoresist (resist) will be stripped as well during this step. If the cleaning step is performed, the semiconductor structure is first cleaned (ex-situ, i.e. outside of a plasma reactor) and the photoresist (resist) is stripped as well during this cleaning step. After the cleaning step, the semiconductor structure is directly transferred in an inductively coupled plasma reactor where the $Si_3N_4$ layer will be etched selectively (this correspond to step (c)).

In any case, the selective etching of the $Si_3N_4$ layer leads to the exposing of the underlying $SiO_2$ layer if present (i.e. if the $SiO_2$ layer was present in the semiconductor structure) or of the Ge-containing (e.g. a SiGe:B) contact region.

Step (d) is optional and is only performed if the $SiO_2$ layer was present in the semiconductor structure. It comprises etching selectively the $SiO_2$ layer if present, thereby exposing the Ge-containing (e.g. a SiGe:B) contact region.

Step (d) can be performed at different times. In one embodiment, it can be performed after the $Si_3N_4$ etch and before the subsequent cleaning step. In another embodiment, it can be performed after the $Si_3N_4$ etch and during the subsequent cleaning step. In another embodiment, it can be performed after the cleaning step subsequent to the $Si_3N_4$ etch. If no cleaning step is performed after step (c), step (d) can be performed after step (c) and before step (e). In embodiments, step (d) can be performed during the contact pre-clean step. The contact pre-clean step can for instance be performed with diluted HF (e.g. 0.5%) for from a few seconds to a few minutes (e.g. 1 min) Other contact pre-clean methods involve other acids (e.g. HCl), sputtering or SiCoNi based processing.

Step (e) is a step of creating a contact on the Ge-containing (e.g. a SiGe:B) contact region. This step can, but does not have to, involve a germanidation step. If it does not involve a germanidation step, contacts made of tungsten (W) can for instance be created. For this purpose, the contact region may be cleaned (contact preclean). A barrier may be deposited where the contacts will be formed in order to promote adhesion of tungsten. The tungsten may then be deposited. This can be followed by chemical mechanical planarization (CMP).

If step (e) involves germanidation, Ni can be deposited on the contact region (e.g. by PVD sputtering) followed by annealing. It is then possible to remove unreacted Ni by e.g. using diluted HCl. Finally, $SiO_2$ can be deposited and CMP may be performed until the germanidated contacts become apparent.

In further aspects, the present disclosure relates to a semiconductor structure (9) obtainable by the method of the first aspect.

In particular, in a second aspect, the present disclosure refers to a semiconductor structure comprising:
  a Ge-containing region,
  a $SiO_2$ layer coating said Ge-containing region, and
  a $Si_3N_4$ layer coating said $SiO_2$ layer.

In an embodiment, said Ge-containing region (3, 12) may comprise a contact region (3) and a non-contact region (12) distinct from one another, wherein said contact region (3) has a contact (16) created thereon, and wherein said $SiO_2$ layer (5) coats said Ge-containing non-contact region (12), and said $Si_3N_4$ layer (6) coats said $SiO_2$ layer (5). In other words, said Ge-containing region (3, 12) may be divided crosswise with respect to the longitudinal direction (X) in which the region extends into a contact region (3) and a non-contact region (12), wherein said contact region (3) has a contact created thereon, and wherein said $SiO_2$ layer (5) coats said Ge-containing non-contact region, and said $Si_3N_4$ layer (6) coats said $SiO_2$ layer (5).

In an embodiment, the Ge-containing region (3, 12) may extend longitudinally along a direction (X) and the contact region (3) and the non-contact region (12) may be positioned subsequently along the longitudinal direction (X). In other words, the Ge-containing region may extend longitudinally along a direction (X) and may be divided longitudinally into a contact region and (at least) a non-contact region.

In an embodiment, said Ge-containing region (3, 12) may extend longitudinally along a direction (X), said region (3, 12) comprising a contact region (3) and a non-contact region (12) positioned subsequently along the longitudinal direction (X), wherein said contact region (3) has a contact (16) created thereon, and wherein said $SiO_2$ layer (5) coats said Ge-containing non-contact region (12), and said $Si_3N_4$ layer (6) coats said $SiO_2$ layer (5).

In a third aspect, the present disclosure relates to a semiconductor structure comprising a Ge-containing region (3, 12) comprising a contact region (3) and a non-contact region (12) distinct from each other, wherein said contact region (3) has a contact (16) created thereon, and wherein the dimensions of a vertical cross-section through said Ge-containing contact region (3) and the dimensions of a vertical cross-section through said Ge-containing non-contact region (12) are substantially the same. For instance, the area of the cross-section of the contact region and the area of the cross-section of the non contact region may be within 5%, 2%, preferably 1% of one another. Also preferably, the width and the height of the cross-section of the contact region and of the cross-section of the non contact region may be within 5%, 2%, preferably 1% of one another.

Such a semiconductor structure (9) is the typical result of the process of the first aspect where said process is applied to a semiconductor structure comprising a Ge-containing region (3, 12), said Ge-containing region (3, 12) comprising a contact region (3) and a non-contact region (12).

In an embodiment, the present disclosure may relate to a semiconductor structure (9) comprising a Ge-containing region (3, 12) extending longitudinally along a direction (X), said region (3, 12) comprising a contact region (3) and a non-contact region (12) positioned subsequently along the longitudinal direction (X), wherein said contact region (3) has a contact (16) created thereon, and wherein the dimensions of a vertical cross-section through said Ge-containing contact region (3) and the dimensions of a vertical cross-section through said Ge-containing non-contact region (12) are substantially the same. In other words, the present disclosure may relate to a semiconductor structure (9) comprising a Ge-containing region (3, 12) extending longitudinally along a direction (X), said region (3, 12) being divided along said direction (X) into a contact region (3) and a non-contact region (12), wherein said contact region (3) has a contact created (16) thereon, and wherein the dimensions of a vertical cross-section through said Ge-containing contact region (3) and the dimensions of a vertical cross-section through said Ge-containing non-contact region (12) are substantially the same. For instance, the area of the cross-section of the contact region and the area of the cross-section of the non contact region may be within 5%, 2%, preferably 1% of one another. Also preferably, the width and the height of the cross-section of the contact region and of the cross-section of the non contact region may be within 5%, 2%, preferably 1% of one another.

In an embodiment, a $SiO_2$ layer (5) may coat said Ge-containing (e.g. a SiGe:B) non-contact region (12), and a $Si_3N_4$ layer (6) coats said $SiO_2$ layer (5). This feature is advantageous for at least two reasons. First, it permits to limit diffusion from the Ge-containing (e.g. a SiGe:B) to the $Si_3N_4$ layer (6) and vice versa. This enhances device stability. Second, it is a remnant of the process wherein this $SiO_2$ layer (5) was used to enhance selectivity. This permits the detection of this layer (5) in the device to serve as a signature that an embodiment of the present disclosure has been used.

In another aspect, the present disclosure relates to a semiconductor structure (9) comprising:
  i. a Ge fin (2),
  ii. a Ge-containing (e.g. a SiGe:B) contact region (3) coating a first part of said Ge fin (2), and
  iii. a Ge-containing (e.g. a SiGe:B) non-contact region (12) coating a second part of said Ge fin (2),
wherein said Ge-containing (e.g. a SiGe:B) contact region (3) and said Ge-containing (e.g. a SiGe:B) non-contact region (12) are positioned subsequently along the longitudinal direction (X) along which the Ge fin (2) extends, wherein said Ge-containing (e.g. a SiGe:B) contact region (3) has a contact (16) created thereon, and wherein the dimensions of a vertical cross-section through said Ge-containing (e.g. a SiGe:B) contact region (3) and the dimensions of a vertical cross-section through said Ge-containing (e.g. a SiGe:B) non-contact region (12) are substantially the same. For instance, the area of the cross-section of the contact region and the area of the cross-section of the non-contact region may be within 5%, 2%, preferably 1% of one another. Also preferably, the width and the height of the cross-section of the contact region and of the cross-section of the non-contact region may be within 5%, 2%, preferably 1% of one another.

In a further aspect, the present disclosure relates to a semiconductor structure (9) comprising a Ge-containing (e.g. a SiGe:B) region (3, 12) extending longitudinally along a direction (X), said region (3, 12) comprising a contact region (3) and a non-contact region (12) positioned subsequently along the longitudinal direction (X), wherein said contact region (3) has a contact (16) created thereon, and wherein a $SiO_2$ layer (5) coats said Ge-containing (e.g. a SiGe:B) non-contact region (12), and a $Si_3N_4$ layer (6) coats said $SiO_2$ layer (5).

In an embodiment, the dimensions of a vertical cross-section through said Ge-containing (e.g. a SiGe:B) contact region (3) and the dimensions of a vertical cross-section through said Ge-containing (e.g. a SiGe:B) non-contact region (12) are substantially the same. For instance, the area of the cross-section of the contact region and the area of the cross-section of the non-contact region may be within 5%, 2%, preferably 1% of one another. Also preferably, the width and the height of the cross-section of the contact region and of the cross-section of the non-contact region may be within 5%, 2%, preferably 1% of one another.

In yet another embodiment, the present disclosure may relate to a semiconductor structure (9) comprising:
  (i) a Ge fin (2),
  (ii) a Ge-containing (e.g. a SiGe:B) contact region (3) coating a first part of said Ge fin (2), and
  (iii) a Ge-containing (e.g. a SiGe:B) non-contact region (12) coating a second part of said Ge fin (2),
wherein said Ge-containing (e.g. a SiGe:B) contact region (3) and said Ge-containing (e.g. a SiGe:B) non-contact region (12) are positioned subsequently along the longitudinal direction (X) along which the Ge fin (2) extends, wherein said Ge-containing (e.g. a SiGe:B) contact region (3) has a contact (16) created thereon, and wherein a $SiO_2$ layer (5) coats said Ge-containing (e.g. a SiGe:B) non-contact region (12), and a $Si_3N_4$ layer (6) coats said $SiO_2$ layer (5).

In any of the aspects and embodiments above, when the dimensions of a vertical cross-section through said Ge-containing contact region (3) and the dimensions of a vertical cross-section through said Ge-containing non-contact region (12) are said to be substantially the same, this may mean that said cross-sections have substantially the same shape and the same area. For instance, the areas may be within 5, 2, 1 or 0.5% of one another.

The presence of vertical cross-sections of same dimensions through the Ge-containing (e.g. a SiGe:B) contact region (3) and through the Ge-containing (e.g. a SiGe:B) non-contact region (12), wherein the Ge-containing (e.g. a SiGe:B) contact region (3) has a contact (16) created thereon is a signature indicating that the process of the present disclosure has been utilized. It is indeed the first time, to the best of the inventors knowledge, that a contact (16) can be created on Ge-containing (e.g. a SiGe:B) contact region (3) without damaging its geometry. Furthermore, such semiconductor structures (9) are advantageous because non-damaged contact regions (3) benefit much the electronic properties of the contacts (16).

In any of the aspects and embodiments above, the semiconductor structure (9) may be comprised in an FET and in particular in a FinFET such as a Ge-BFFT.

In any embodiment of any aspect, the Ge-containing (e.g. a SiGe:B) contact region (3) may be a part of a source (13) and/or a part of a drain (17) region of a field effect transistor (9). Similarly, in any embodiment of any aspect, the Ge-containing (e.g. a SiGe:B) non-contact region (12) may be a part of a source (13) and/or a part of a drain (17) region of a field effect transistor (9). Within a Ge-containing region (3, 12) such as a drain region (17) or a source region (13), a contact region (3) (region of the source/drain where contacts will be created) and a non-contact region (12) (region of the source/drain) where no contacts will be created) can be present.

In any embodiment of the first or second aspect, said Ge fin (2) may have a width of from 5 to 20 nm.

In any embodiment of the first or second aspect, said $SiO_2$ layer (5) may have a thickness of from 1 to 10 nm, preferably 1 to 5 nm.

In any embodiment of the first or second aspect, said $Si_3N_4$ layer (6) may have a thickness of from 5 to 100 nm, preferably from 10 to 50 nm, more preferably from 15 to 35 nm.

In any embodiment of the first or second aspect, said anti-reflective coating (7) may have a thickness of from 10 to 50 nm, preferably from 20 to 40 nm.

EXAMPLE

A process according to an embodiment of the present disclosure is schematized in FIGS. 1 to 4. FIG. 1 shows a semiconductor structure (9) comprising:

i. A SiGe:B contact region (3) covering a Ge fin (2),
ii. An optional $SiO_2$ layer (5) coating said SiGe:B contact region (3),
iii. A $Si_3N_4$ layer (6) coating said $SiO_2$ layer (5),
iv. A $SiO_2$ blanket (4) covering said $Si_3N_4$ layer (6),
v. An anti-reflective coating (7) covering said $SiO_2$ blanket (4), and
vi. A photoresist pattern (8) provided over said anti-reflective coating (7).

This semiconductor structure (9) is a stack obtained after lithography of the resist (8). Providing this stack corresponds to an example of step (a) of the first aspect of the present disclosure.

Figure 2:
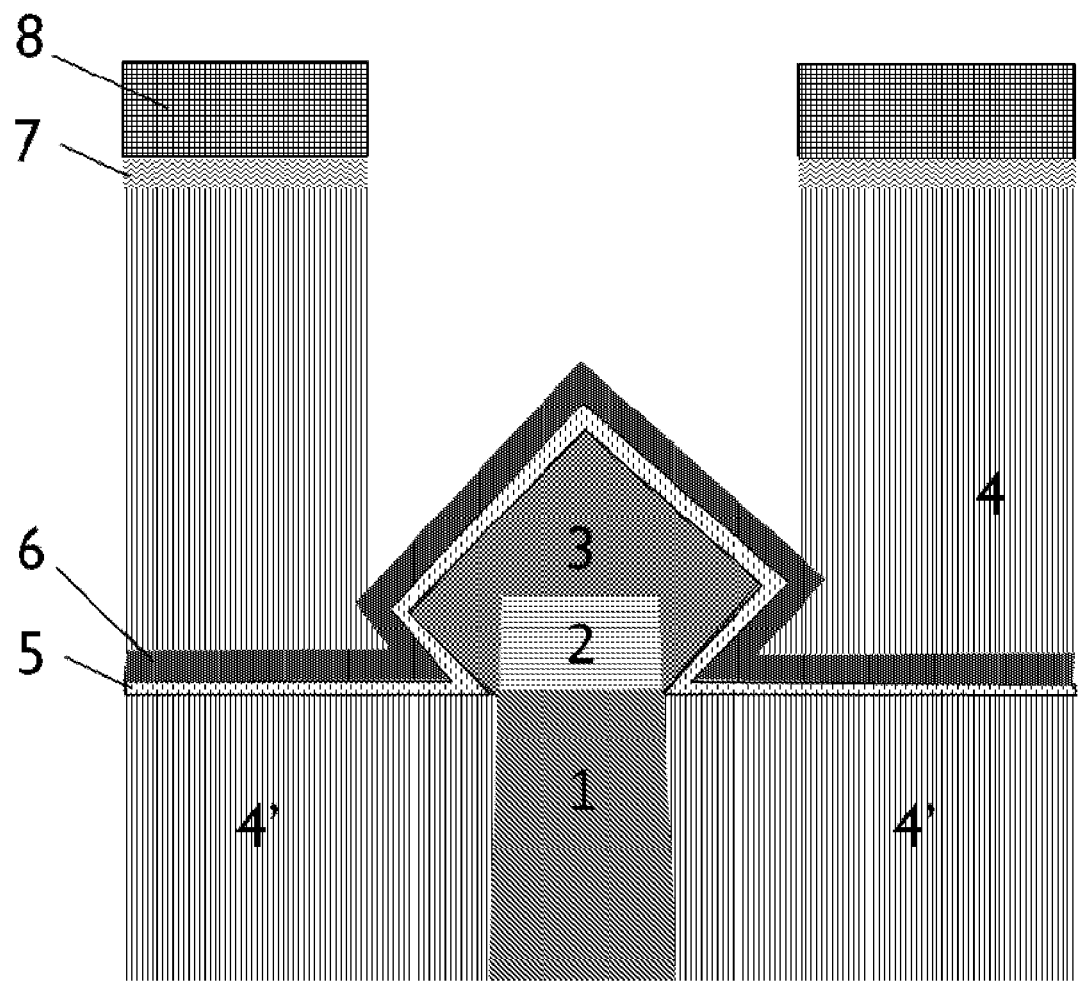

FIG. 2 shows the resulting structure after selective etching of the anti-reflective coating (7) and of the $SiO_2$ blanket (4). In a first sub-step (b1), the anti-reflective coating (7) was etched by means of a capacitively coupled plasma through the photoresist pattern (8). The plasma was generated at a RF frequency of 27 MHz with a power of 700 W under a pressure of 60 mtorr. The etching gas could be fed into the processing chamber via two different paths: a central path and an edge path. In the present sub-step (b1), 50% of the etching gases were fed via the center path. The etching gas used was pure $CF_4$ delivered at a rate of −200 sccm. This sub-step (b1) lasted 28 seconds and resulted in the uncovering of the $SiO_2$ blanket (4). The temperature inside the reactor (before plasma generation) was 20° C. In a second sub-step (b2), The $SiO_2$ blanket (4) was etched by means of a capacitively coupled plasma through the photoresist pattern (8) in a sub-step (b2). The plasma was generated by two generators. A first generator was operating at a RF frequency of 2 MHz with a power of 1250 W and a second generator was operating at a RF frequency of 27 MHz with a power of 750 W. The pressure in the processing chamber was 40 mtorr. 30% of the etching gases were fed via the center path. The etching gas used was a mixture of $O_2$, $C_4F_8$, $C_4F_6$, and Ar delivered at 18 sccm, 9 sccm, 11 sccm, and 300 sccm respectively. This sub-step (b2) lasted 38 seconds and resulted in the uncovering of the $Si_3N_4$ layer (6). The temperature inside the reactor (before plasma generation) was 40° C. Next, the resist was stripped in-situ. This step could be performed in-situ because no cleaning was necessary. For this purpose, exposure to an $O_2$ plasma for 30-40 seconds was used. Alternatively, if a cleaning is necessary, instead of stripping the resist in situ, the resist can be stripped ex-situ during steps involving the use of $N_2O$, forming gas and a washing in HF.

Figure 3:
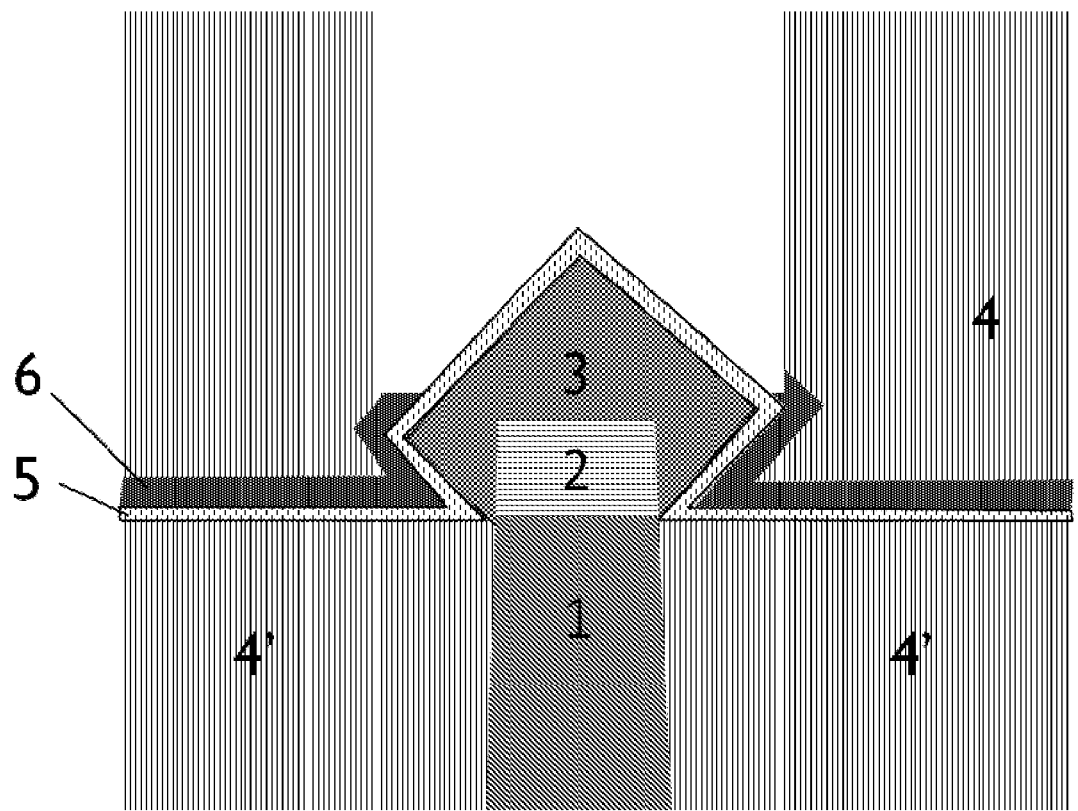

FIG. 3 shows the resulting structure after selective etching of the $Si_3N_4$ layer (6). The $Si_3N_4$ layer (6) was etched by means of an inductively coupled plasma (Lam Research Kiyo C). This etching process was performed in two sub-steps. In sub-step (c1), which was a short breakthrough step, the plasma was generated at a frequency of 13.5 MHz with a transformer coupled plasma RF power of 200 W (source power), a TCCT setpoint of 0.1 (TCCT stands for transformer-coupled capacitive tuning; this is a parameter permitting to control the uniformity of the plasma by applying different bias to a segmented top planar ICP coil. In the present case, this parameter was tuned so as to have a maximum plasma density in the center of the chamber and not at the edges), a bias RF voltage of 65 V under a pressure of 3 mtorr. The etching gas used was a mixture of $CF_4$ and Ar delivered at a rate of 50 sccm and 50 sccm respectively. The inner electrostatic chuck (ESC) temperature was 75° C. This sub-step (c1) lasted 8 seconds and was directly followed by sub-step (c2). The purpose of sub-step (c1) was to refresh the surface of the wafer after the transfer from the CCP to the ICP reactor. This transfer involves uncontrolled air exposure. Sub-step (c2) consisted in a further etching of the $Si_3N_4$ layer (6). The plasma was generated at a frequency of 13.5 MHz with a transformer coupled plasma RF power of 500 W (source power), a TCCT setpoint of 0.5, a bias RF power of 0 W, a bias RF voltage of 200 V and a bias power learned of 30.6 W under a pressure of 45 mtorr. 100% of the etching gases were fed via the center path. The etching gas used was a mixture of $CH_3F$ and $O_2$ delivered at a rate of 200 sccm and 100 sccm respectively. This sub-step (c2) lasted 46 seconds. The inner ESC temperature was 75° C.

Figure 4:
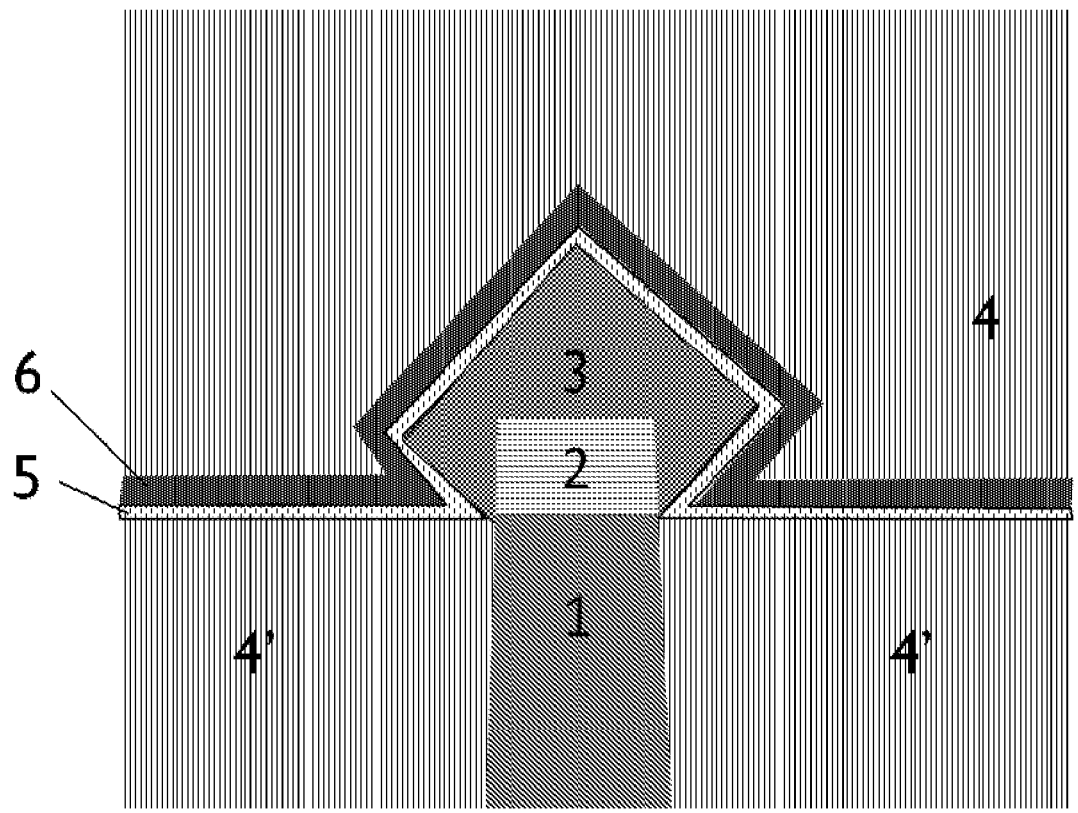

FIG. 4 shows the resulting structure after selective etching of the $SiO_2$ layer (5). The SiGe:B contact region (3) is exposed. This etching was performed together with a cleaning step by using a mixture of $N_2O$ and forming gas and/or using HF.

A contact was then created on said SiGe:B contact region (3) by sputtering Ni via physical vapour deposition followed by annealing at a temperature in the range 230-300° C. A washing step was thereafter performed by means of diluted HCl in order to remove unreacted Ni. Alternatively, if no germaniding is performed, the etching of the SiO₂ layer (5) can be performed during a contact pre-clean step preceding a contact barrier deposition followed by W deposition and chemical mechanical planarization. The contact pre-clean step can for instance be performed with diluted HF (e.g. 0.5%) for from a few seconds to a few minutes (e.g. 1 min) Other contact pre-clean methods involve other acids (e.g. HCl), sputtering or SiCoNi based processing.

FIG. 9 shows three semiconductor structures A, B, and C. The semiconductor structures A and B only differ by their size, i.e. by their critical dimensions. Each of them is structurally identical to the one of FIG. 2 and corresponds to the structure of either a source (13) or a drain (17) of a Field Effect Transistor (FET). The semiconductor structure C is a gate structure of an FET. Although all three structures are presented side by side for the sake of clarity, in an actual device, both structures B and C would share the same fin (2) and would be spaced away longitudinally with respect to a longitudinal direction (X) along which the fin (2) extends. Structure C could share (different portions of) the same SiGe fin (1) and Ge fin (2) as structure B or structure A. SiGe fin (1) and Ge fin (2) in structure C are depicted with dimensions different from those of SiGe fin (1) and Ge fin (2) in structure A or structure B. However, in an actual device, the dimensions of SiGe fin (1) and Ge fin (2) in structure A (or structure B) would typically be the same as the dimensions of SiGe fin (1) and Ge fin (2) in structure C. This direction X is perpendicular to the plane of the drawing. In a typical FET, a source (13), a gate structure (14) and a drain (17) would share the same fin (2) and would follow each other longitudinally with respect to a longitudinal direction (X) along which the fin (2) extends. The gate structure (14) is composed of a gate dielectric (10) and a gate electrode (11). The portion of the fin (2) covered by the gate dielectric (11) corresponds to the channel of the FET.

Figure 10:
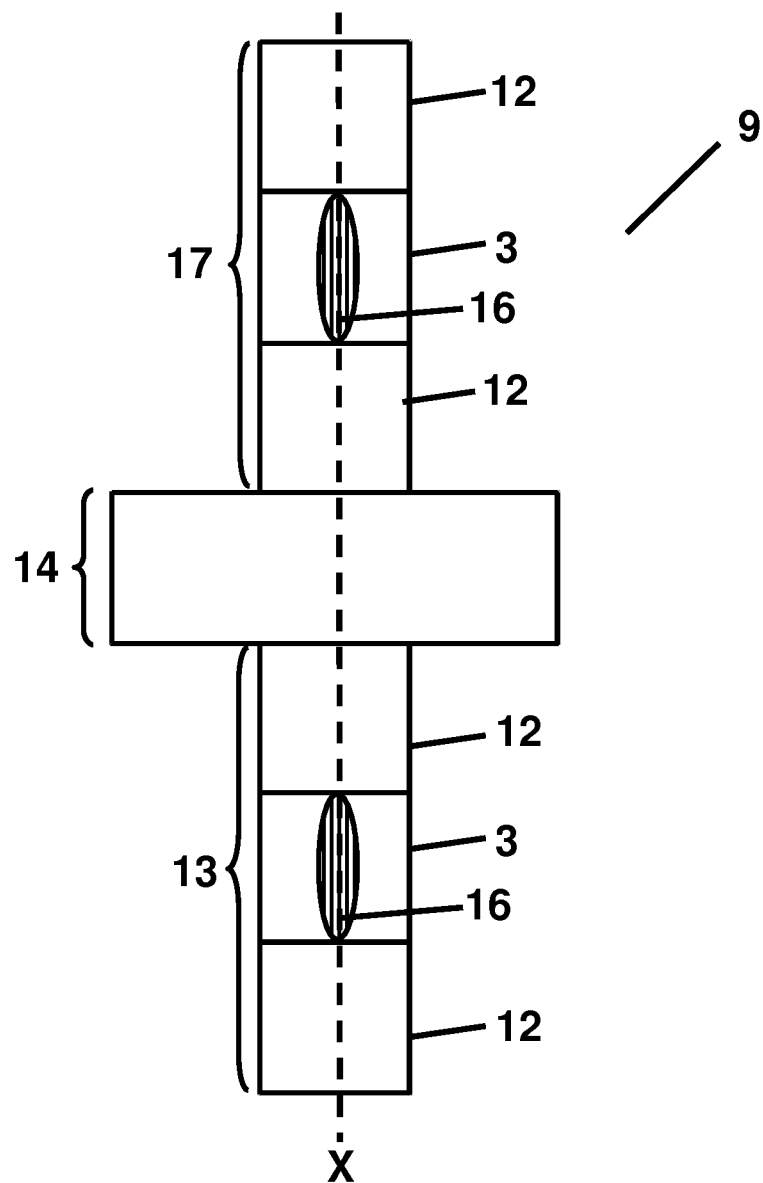
FIG. 10 is a schematic top view of a Field Effect Transistor according to embodiments of the present disclosure.

FIG. 10 schematically shows a semiconductor structure (9) corresponding to a Field Effect Transistor (9) and more particularly a FinFET (9) viewed from the top and extending longitudinally along the longitudinal direction (X). It comprises a source (13), a gate structure (14), and a drain (17). Each of the source (13) and the drain (17) comprises a contact region (3) and at least a non-contact region (12). Contacts (16) are present on the contact regions (3). By definition, a contact region (3) is a region of the semiconductor structure (9) on which contacts (16) are created or will be created. In embodiments, the longitudinal extent of a contact region (3) is defined by the longitudinal extent of the contact (16) present thereon or that will be present thereon.

It is to be understood that although preferred embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A process for creating a contact on a Ge-containing contact region of a semiconductor structure, said process comprising the steps of:
(a) providing said semiconductor structure comprising:
  (i) a Ge-containing contact region,
  (ii) optionally, a SiO₂ layer coating said Ge-containing contact region,
  (iii) a Si₃N₄ layer coating said SiO₂ layer if present or said Ge-containing contact region,
(c) etching selectively the Si₃N₄ layer by means of an inductively coupled plasma, thereby exposing the underlying SiO₂ layer if present or the Ge-containing contact region,
(d) etching selectively the SiO₂ layer if present, thereby exposing the Ge-containing contact region, and
(e) creating said contact on said Ge-containing contact region.

2. The process according to claim 1, wherein said semiconductor structure further comprises:
  (iv) a SiO₂ blanket covering said Si₃N₄ layer,
  (v) an anti-reflective coating covering said SiO₂ blanket,
  (vi) a photoresist pattern provided over said anti-reflective coating, and wherein said process further comprises between step (a) and step (c) the step of:
b) etching selectively the anti-reflective coating and the SiO₂ blanket by means of a capacitively coupled plasma through the photoresist pattern, thereby exposing the underlying Si₃N₄ layer.

3. The process according to claim 2, wherein a plasma used in step (b) is produced from an etching gas comprising a fluorocarbon reactant preferably selected from $CH_3F$, $CF_4$, $C_4F_8$ and $C_4F_6$.

4. The process according to claim 2, wherein a plasma used in step (b) and step (c) is produced from an etching gas comprising a fluorocarbon reactant preferably selected from $CH_3F$, $CF_4$, $C_4F_8$ and $C_4F_6$.

5. The process according to claim 2, wherein step (b) comprises a first sub-step (b1) for etching the anti-reflective coating and a subsequent sub-step (b2) for etching the SiO₂ blanket, wherein the plasma used during sub-step (b1) is produced from an etching gas comprising a fluorocarbon reactant and an optional inert carrier gas, and wherein the plasma used during subsequent sub-step (b2) is produced from an etching gas comprising a fluorocarbon reactant, an oxygen reactant and an optional inert carrier gas.

6. The process according to claim 5, wherein the fluorocarbon reactant used for the first sub-step (b1) is $CF_4$.

7. The process according to claim 5, wherein the fluorocarbon reactant used for the subsequent sub-step (b2) is $C_4F_8$, $C_4F_6$ or a mixture thereof.

8. The process according to claim 2, wherein a cleaning step is performed after step (b) but before step (c) and/or a cleaning step is performed after step (c) but before step (d), wherein said cleaning step is performed by using a mixture of N₂O and forming gas and/or by using HF.

9. The process according to claim 1, wherein creating a contact involves depositing a metal on said Ge-containing contact region.

10. The process according to claim 9, wherein said metal is selected from Ni and W, and wherein when said metal is Ni, said process further comprises the step of annealing said Ni, thereby germaniding said Ni with said Ge-containing contact region.

11. The process according to claim 1, wherein a plasma used in step (c) is produced from an etching gas comprising a fluorocarbon reactant preferably selected from $CH_3F$, $CF_4$, $C_4F_8$ and $C_4F_6$.

12. The process according to claim 1, wherein step (c) comprises a first sub-step (c1) and a subsequent sub-step (c2), wherein the plasma used during sub-step (c1) is produced from an etching gas comprising a fluorocarbon reactant and an optional inert carrier gas and wherein the plasma used during subsequent sub-step (c2) is produced from an etching gas comprising a fluorocarbon reactant, an oxygen reactant and an optional inert carrier gas.

13. The process according to claim 1, wherein said Ge-containing contact region is part of a source or part of a drain region of a field effect transistor.

14. A semiconductor structure comprising:
   a Ge-containing region;
   a $SiO_2$ layer coating said Ge-containing region; and
   a $Si_3N_4$ layer coating said $SiO_2$ layer,
wherein said Ge-containing region extends longitudinally along a direction (X), said region comprising a contact region and a non-contact region positioned subsequently along the longitudinally direction (X), wherein said contact region has a contact created thereon, and wherein said $SiO_2$ layer said contact region and non-contact region, and said $Si_3N_4$ layer coats said $SiO_2$ layer.

15. A semiconductor structure comprising a Ge-containing region extending longitudinally along a direction (X), said region comprising a contact region and a non-contact region positioned subsequently along the longitudinal direction (X), wherein said contact region has a contact created thereon, and wherein the dimensions of a vertical cross-section through said contact region and the dimensions of a vertical cross-section through said Ge-containing non-contact region are substantially the same.

16. The semiconductor structure according to claim 15, wherein a $SiO_2$ layer coats said Ge-containing non-contact region, and a $Si_3N_4$ layer coats said $SiO_2$ layer.

17. The semiconductor structure according to claim 16, wherein said Ge-containing contact region is part of a source or part of a drain region of a field effect transistor.

18. A process for creating a contact on a Ge-containing contact region of a semiconductor structure, said process comprising the steps of:
   (a) providing said semiconductor structure comprising:
      (i) a Ge-containing contact region,
      (ii) optionally, a $SiO_2$ layer coating said Ge-containing contact region,
      (iii) a $Si_3N_4$ layer coating said $SiO_2$ layer if present or said Ge-containing contact region,
      (iv) a $SiO_2$ blanket covering said $Si_3N_4$ layer,
      (v) an anti-reflective coating covering said $SiO_2$ blanket,
      (vi) a photoresist pattern provided over said anti-reflective coating;
   (b) etching selectively the anti-reflective coating and the $SiO_2$ blanket by means of a capacitively coupled plasma through the photoresist pattern, thereby exposing the underlying $Si_3N_4$ layer;
   (c) etching selectively the $Si_3N_4$ layer by means of an inductively coupled plasma, thereby exposing the underlying $SiO_2$ layer if present or the Ge-containing contact region;
   (d) etching selectively the $SiO_2$ layer if present, thereby exposing the Ge-containing contact region; and
   (e) creating said contact on said Ge-containing contact region.

* * * * *